(12) United States Patent
Kim

(10) Patent No.: US 12,401,002 B2
(45) Date of Patent: Aug. 26, 2025

(54) LIGHT EMITTING DIODE ARRAY CONTAINING A BLACK MATRIX AND AN OPTICAL BONDING LAYER AND METHOD OF MAKING THE SAME

(71) Applicant: SAMSUNG ELECTRONICS CO., LTD., Suwon-si (KR)

(72) Inventor: Brian Kim, Santa Clara, CA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 35 days.

(21) Appl. No.: 18/471,517

(22) Filed: Sep. 21, 2023

(65) Prior Publication Data

US 2024/0113084 A1    Apr. 4, 2024

Related U.S. Application Data

(60) Continuation of application No. 17/563,472, filed on Dec. 28, 2021, now Pat. No. 11,769,758, which is a
(Continued)

(51) Int. Cl.
| | |
|---|---|
| *H01L 25/075* | (2006.01) |
| *H10D 86/40* | (2025.01) |
| *H10D 86/60* | (2025.01) |
| *H10H 20/85* | (2025.01) |
| *H10H 20/853* | (2025.01) |

(Continued)

(52) U.S. Cl.
CPC .......... *H01L 25/0753* (2013.01); *H10D 86/40* (2025.01); *H10D 86/60* (2025.01); *H10H 20/8506* (2025.01); *H10H 20/853* (2025.01); *H10H 20/855* (2025.01); *H10H 20/857* (2025.01); *H10K 50/865* (2023.02); *H10K 59/00* (2023.02); *H10K 59/12* (2023.02); *H10K 59/8792* (2023.02); *H01L 25/167* (2013.01); *H10H 20/0362* (2025.01); *H10H 20/0363* (2025.01); *H10H 20/0364* (2025.01);
(Continued)

(58) Field of Classification Search
CPC ...... H10K 50/865; H10K 59/00; H10K 59/12; H10K 59/8792; H01L 25/0753
See application file for complete search history.

(56) References Cited

U.S. PATENT DOCUMENTS

| | | |
|---|---|---|
| 8,309,439 B2 | 11/2012 | Seifert et al. |
| 9,281,442 B2 | 3/2016 | Romano et al. |

(Continued)

OTHER PUBLICATIONS

Extended European Search Report, for European Patent Application No. 19852141.1 mailed Apr. 19, 2022, 10 pages.
(Continued)

*Primary Examiner* — Britt D Hanley
*Assistant Examiner* — Victor V Barzykin
(74) *Attorney, Agent, or Firm* — Sughrue Mion, PLLC

(57) ABSTRACT

A light emitting device includes a backplane, an array of light emitting diodes attached to a front side of the backplane, a transparent conductive layer contacting front side surfaces of the light emitting diodes, an optical bonding layer located over a front side surface of the transparent conductive layer, a transparent cover plate located over a front side surface of the optical bonding layer, and a black matrix layer including an array of openings therethrough, and located between the optical bonding layer and the transparent cover plate.

20 Claims, 7 Drawing Sheets

Related U.S. Application Data division of application No. 16/111,638, filed on Aug. 24, 2018, now Pat. No. 11,239,212.

(51) Int. Cl.
*H10H 20/855* (2025.01)
*H10H 20/857* (2025.01)
*H10K 50/86* (2023.01)
*H10K 59/00* (2023.01)
*H10K 59/12* (2023.01)
*H10K 59/80* (2023.01)
*H01L 25/16* (2023.01)
*H10H 20/01* (2025.01)
*H10H 20/832* (2025.01)
*H10K 59/131* (2023.01)

(52) U.S. Cl.
CPC ......... *H10H 20/835* (2025.01); *H10K 59/131* (2023.02); *H10K 59/871* (2023.02)

(56) References Cited

U.S. PATENT DOCUMENTS

| | | | |
|---|---|---|---|
| 9,287,443 | B2 | 3/2016 | Konsek et al. |
| 11,239,212 | B2 | 2/2022 | Kim |
| 2002/0131008 | A1 | 9/2002 | Iwase et al. |
| 2003/0071954 | A1 | 4/2003 | Krum et al. |
| 2005/0077814 | A1* | 4/2005 | Koo ................ H10K 59/80522 |
| | | | 313/500 |
| 2009/0114928 | A1 | 5/2009 | Messere et al. |
| 2010/0044726 | A1* | 2/2010 | Li ......................... H05K 3/284 |
| | | | 438/118 |
| 2011/0143472 | A1 | 6/2011 | Seifert et al. |
| 2011/0199684 | A1* | 8/2011 | Hashimoto ............ G02B 5/201 |
| | | | 427/523 |
| 2014/0246650 | A1 | 9/2014 | Konsek et al. |
| 2015/0207028 | A1 | 7/2015 | Romano et al. |
| 2015/0340655 | A1 | 11/2015 | Lee et al. |
| 2015/0362165 | A1* | 12/2015 | Chu ........................ H01L 33/32 |
| | | | 362/235 |
| 2017/0077436 | A1 | 3/2017 | Yue et al. |
| 2018/0122836 | A1* | 5/2018 | Kang .................... H01L 33/505 |
| 2018/0226597 | A1* | 8/2018 | Byun ...................... H10K 71/00 |
| 2018/0277609 | A1* | 9/2018 | Fukiwara ............... G02B 5/201 |
| 2018/0358579 | A1 | 12/2018 | Chen et al. |
| 2020/0066687 | A1 | 2/2020 | Kim |
| 2022/0122949 | A1 | 4/2022 | Kim |

OTHER PUBLICATIONS

Shin-Etsu, "Shin-Etsu Silicone Product Guide 4th Wearable Expo—Wearable Devices & Technology Expo," Jan. 1, 2018, pp. 1-16, XP055910223, retrieved from the Internet: https://www.shinetsusilicone-global.com/news/2018/images/4th_wearable_EN.pdf.

Notification of Transmittal of the International Search Report and Written Opinion of the International Search Authority for International Patent Application No. PCT/US2019/045545, mailed Nov. 29, 2019, 12 pages.

Notification Concerning Transmittal of International Preliminary Report on Patentability and Written Opinion of the International Search Authority for International Patent Application No. PCT/US2019/045545, mailed Mar. 11, 2021, 9 pages.

* cited by examiner

LIGHT EMITTING DIODE ARRAY CONTAINING A BLACK MATRIX AND AN OPTICAL BONDING LAYER AND METHOD OF MAKING THE SAME

FIELD

The present invention relates to light emitting devices, and particularly to light emitting devices including light emitting diode arrays containing an optical bonding layer and a black matrix and methods of fabricating the same.

BACKGROUND

Light emitting devices such as light emitting diodes (LEDs) are used in electronic displays, such as backlights in liquid crystal displays located in laptops or televisions, LED billboards, microdisplays, and LED televisions. A microLED refers to a light emitting diode having lateral dimensions that do not exceed 1 mm. A microLED has a typical lateral dimension in a range from 1 microns to 150 microns. An array of microLEDs can form an individual pixel element. A direct view display device can include an array of pixel elements, each of which includes several microLEDs which emit light having a different emission spectrum.

SUMMARY

According to an aspect of the present disclosure, a light emitting device includes a backplane, an array of light emitting diodes attached to a front side of the backplane, a transparent conductive layer contacting front side surfaces of the light emitting diodes, an optical bonding layer located over a front side surface of the transparent conductive layer, a transparent cover plate located over a front side surface of the optical bonding layer, and a black matrix layer including an array of openings therethrough, and located between the optical bonding layer and the transparent cover plate.

According to another aspect of the present disclosure, a method of forming a light emitting device is provided, which comprises the steps of: attaching an array of light emitting diodes to a front side of a backplane; forming a dielectric matrix layer on the front side of the backplane and around the array of light emitting diodes; forming a transparent conductive layer on front side surfaces of the light emitting diodes and over the dielectric matrix layer; disposing a transparent cover plate over a front side of the transparent conductive layer, wherein the transparent cover plate is vertically spaced from the front side of the transparent conductive layer by a gap; and filling the gap with an optically bonding layer by injecting a transparent dielectric material into the gap.

DETAILED DESCRIPTION

Figure 1:
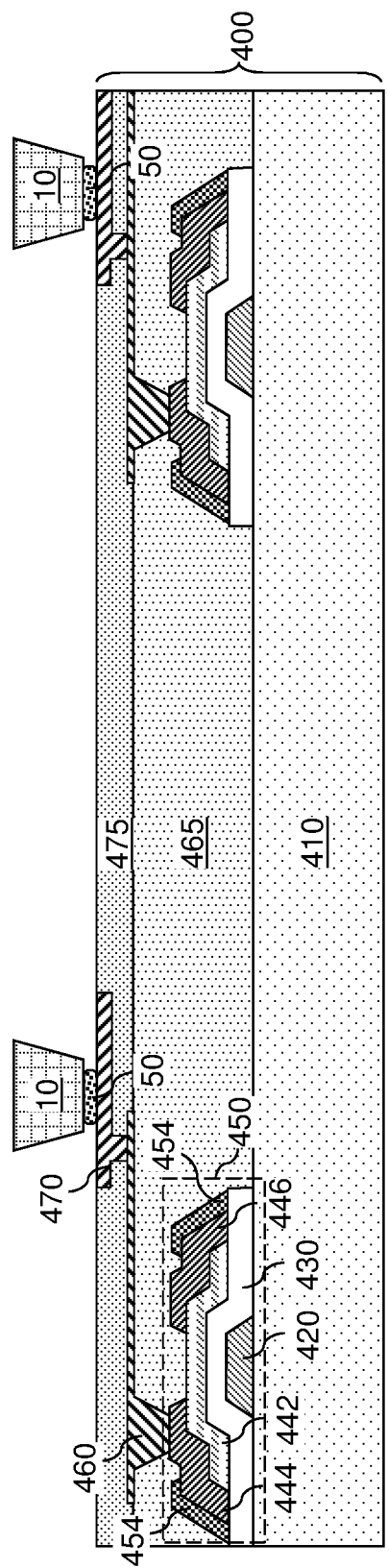
FIG. 1 is a vertical cross-sectional view of an exemplary structure after forming an array of light emitting diodes on a backplane according to an embodiment of the present disclosure.

As discussed above, the present disclosure is directed to light emitting diode arrays an optical bonding layer and a black matrix and methods of fabricating the same. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "layer" refers to a continuous portion of at least one material including a region having a thickness. A layer may consist of a single material portion having a homogeneous composition, or may include multiple material portions having different compositions.

As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "semiconducting material" refers to a material having electrical conductivity in the range from $1.0 \times 10^{-6}$ S/cm to $1.0 \times 10^5$ S/cm. As used herein, a "metallic material" refers to a conductive material including at least one metallic element therein. All measurements for electrical conductivities are made at the standard condition.

A display device, such as a direct view display can be formed from an ordered array of pixels. Each pixel can include a set of subpixels that emit light at a respective emission spectrum. For example, a pixel can include a red subpixel, a green subpixel, and a blue subpixel. Each subpixel can include one or more light emitting diodes that emit light of a particular wavelength. Each pixel is driven by a backplane circuit such that any combination of colors within a color gamut may be shown on the display for each pixel. The display panel can be formed by a process in which LED subpixels are soldered to, or otherwise electrically attached to, a bond pad located on a backplane. The bond pad is electrically driven by the backplane circuit and other driving electronics.

In the embodiments of the present disclosure, a method for fabrication of a multicolor (e.g., three or more color) direct view display may be performed by using light emitting devices which emit different color light in each pixel. In one embodiment, nanostructure (e.g., nanowire) or bulk (e.g., planar) LEDs may be used. Each LED may have a respective blue, green and red light emitting active region to form blue, green and red subpixels in each pixel. In another embodiment, a down converting element (e.g., red emitting phosphor, dye or quantum dots) can be formed over a blue or green light emitting LED to form a red emitting subpixel. In another embodiment, a blue or green light emitting nanowire LED in each subpixel is paired with a red emitting planar LED, such as an organic or inorganic red emitting planar LED to form a red emitting subpixel.

Referring to FIG. 1 an exemplary structure according to a first embodiment of the present disclosure includes a backplane 400 and an array of light emitting diodes 10 attached to a front side of the backplane 400 through an array of solder contacts, such as solder layer or solder balls 50. The backplane 400 includes a backplane substrate 410, which can be an insulating substrate. A control circuitry for controlling operation of the light emitting diodes attached to the backplane 400 may be provided within the backplane. For example, switching devices 450 can be provided within the backplane 400. In an illustrative example, the switching devices 450 can include field effect transistors, such as thin film transistors (TFTs). In this case, each field effect transistor 450 may include a gate electrode 420, a gate dielectric 430, a channel region 442, a source region 446, and a drain region 444. While an inverted staggered TFT 450 is shown in FIG. 1, other types of TFTs, such as inverted coplanar, top gated staggered and top gated coplanar TFTs can be used instead. Various electrical wirings can be provided to interconnect the various electrical nodes of the field effect transistors to electrical interfaces (not expressly shown) on the backplane 400. A patterned passivation layer 454 may be optionally formed on the source regions 446 and the drain regions 444. Additional interconnect wiring may be provided as needed. The switching devices 450 can be encapsulated by an encapsulation dielectric layer 465. First-level metal interconnect structures 460 can be formed through the encapsulation dielectric layer 465 to a node of a respective switching device 450 such as a drain region 444. An interconnect level dielectric layer 475 may be formed over the encapsulation dielectric layer 465, and second-level metal interconnect structures 470 can be formed through the interconnect level dielectric layer 475 on the first-level metal interconnect structures 460. The second-level metal interconnect structures 470 can include an array of bonding pads for attaching the array of light emitting diodes 10.

Each light emitting diode 10 can be any diode configured to emit light along a direction away from the backplane 400 and having at least one bonding pad facing the backplane 400. A light emitting diode 10 may be formed by sequentially a first doped compound semiconductor layer (such as an n-doped GaN layer) having a doping of a first conductivity type on a transparent single crystalline substrate such as a sapphire substrate, an active region (e.g., one or more InGaN/GaN quantum wells) and a doped compound semiconductor layer (such as a p-type GaN layer) of a second conductivity type. Optionally, rather than depositing a first doped compound semiconductor layer to form a planar LED, semiconductor mesas, nanowires or nanopyramids can be formed instead, followed by forming active region and second conductivity type layers, shells or nanowire portions over the mesas, nanowires or nanopyramids. Methods of forming nanowire LEDs are described in U.S. Pat. No. 9,287,443 to Konsek et al., and U.S. Pat. No. 9,281,442 to Romano et al., each of which is assigned to Glo AB and U.S. Pat. No. 8,309,439 to Seifert et al., which is assigned to QuNano AB, all of which are incorporated herein by reference in their entirety.

Solder balls 50 can be attached to a device-side bonding pad of each light emitting diode 10. Each solder ball 50 on a light emitting diode 10 that needs to be attached to the backplane 400 can be reflowed so that an overlying light emitting diode 10 is bonded to the backplane. The reflow may be conducted by heating the solder balls by irradiating by an infrared laser beam through the backplane 400 or through the LEDs 10 onto the solder balls 50 or by annealing the device in a furnace or similar heating apparatus above the solder ball 50 melting temperature.

Figure 2:
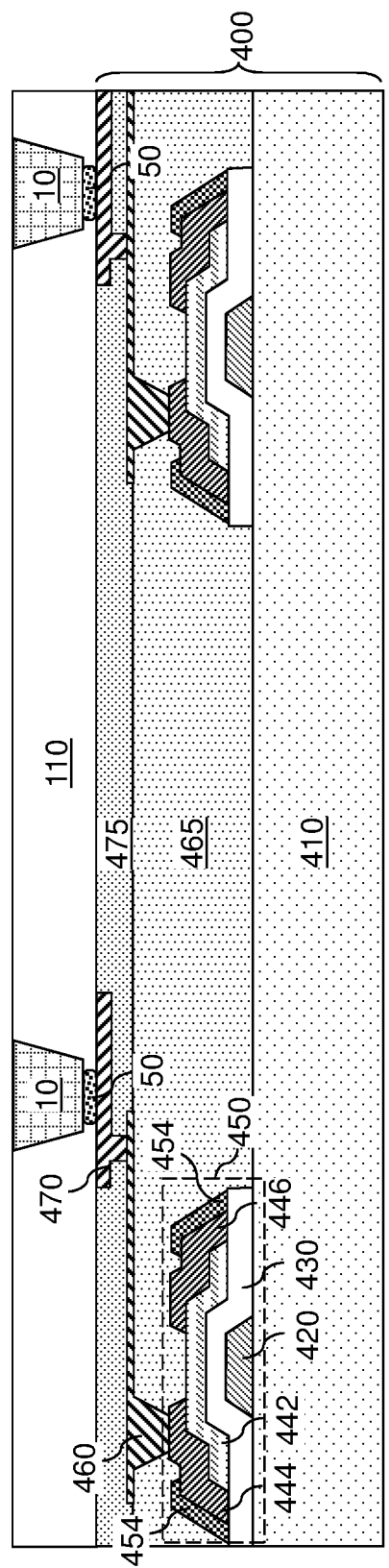
FIG. 2 is a vertical cross-sectional view of the exemplary structure after depositing and planarizing a dielectric matrix layer according to an embodiment of the present disclosure.

Referring to FIG. 2, a planarizable dielectric material layer is deposited over the backplane 400 between the array of light emitting diodes 10. The planarizable dielectric material layer can be a silicon oxide-based material such as undoped silicate glass, a doped silicate glass (such as borosilicate glass, phosphosilicate glass, or borophosphosilicate glass), or a flowable oxide (FOX)), silicone, or an organic material such as resin. The planarizable dielectric material can be deposited by spin coating or chemical vapor deposition (such as sub-atmospheric chemical vapor deposition, plasma enhanced chemical vapor deposition, roller coating, blade coating, or dipping in a solution bath).

The planarizable dielectric material is either self-planarized if deposited by spin coating or can be subsequently planarized, for example, by chemical mechanical planarization (CMP). The remaining continuous portion of the planarizable dielectric material layer is herein referred to as a dielectric matrix layer 110. The dielectric matrix layer 110 can be formed on the front side of the backplane 400 and around the array of light emitting diodes 10. The dielectric matrix layer 110 embeds the array of light emitting diodes 10. The top surface of the dielectric matrix layer 110 can be coplanar with the top surfaces of the light emitting diodes 10. The dielectric matrix layer 110 is located on the front side of the backplane 400, and laterally surrounds the array of light emitting diodes 10.

Figure 3:
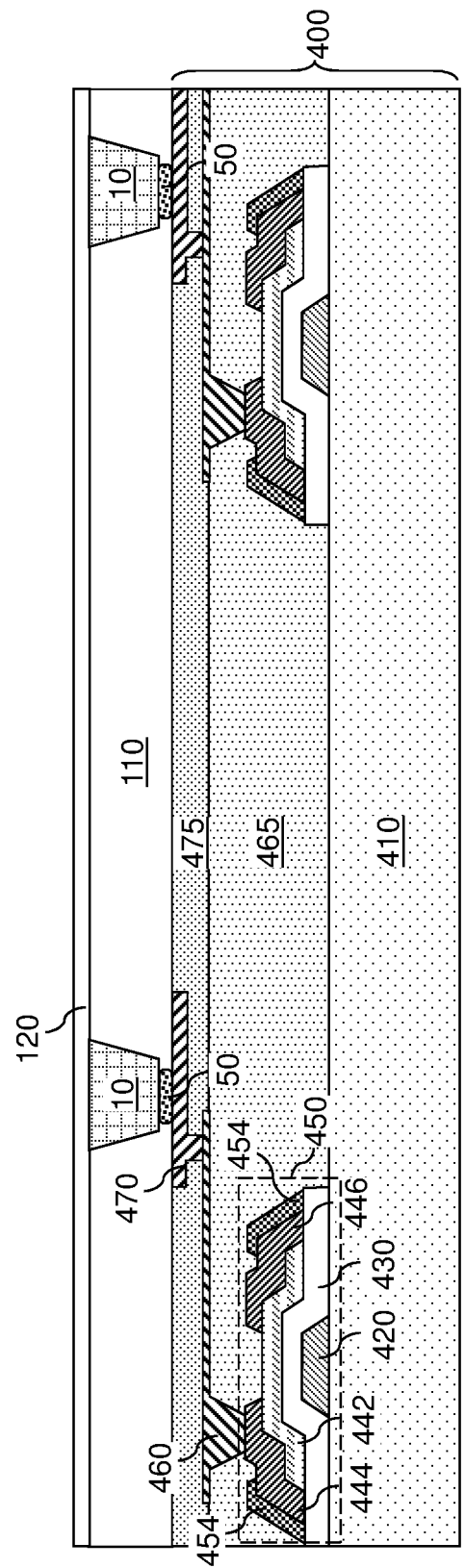
FIG. 3 is a vertical cross-sectional view of the exemplary structure after formation of a transparent conductive layer according to an embodiment of the present disclosure.

Referring to FIG. 3 a transparent conductive layer 120 can be formed on front side surfaces of the light emitting diodes 10 and over the dielectric matrix layer 110. In one embodiment, the transparent conductive layer 120 can be formed directly on the top surfaces, i.e., the front side surfaces, of the light emitting diodes 10. The transparent conductive layer 120 can include a transparent conductive material such as indium tin oxide or aluminum doped zinc oxide. The transparent conductive layer 120 can be deposited as a continuous material layer that extends across the entire area of the array of light emitting diodes 10. The thickness of the transparent conductive layer 120 can be in a range from 20 nm to 600 nm, such as from 100 nm to 300 nm, although lesser and greater thicknesses can also be employed. The transparent conductive layer 120 can function as a common electrode (such as a cathode) of the array of light emitting diodes 10. The transparent conductive layer 120 forms a part of a bus electrode for the device. In one embodiment, the transparent conductive layer 120 can be an unpatterned blanket material layer having a uniform thickness and not containing any opening over the area of the array of light emitting diodes 10.

Figure 4A:
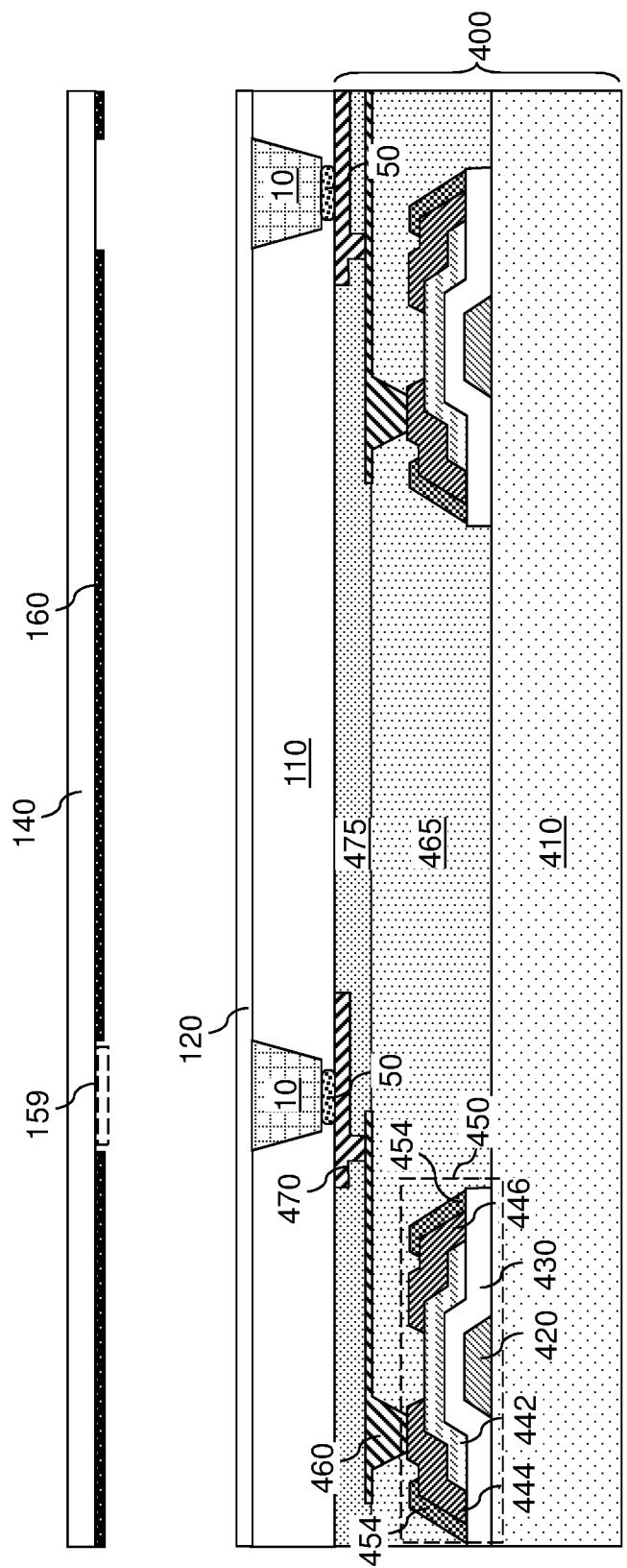
FIG. 4A is a vertical cross-sectional view of the exemplary structure after providing a transparent cover plate coated with a patterned black matrix layer according to an embodiment of the present disclosure.
Figure 4B:
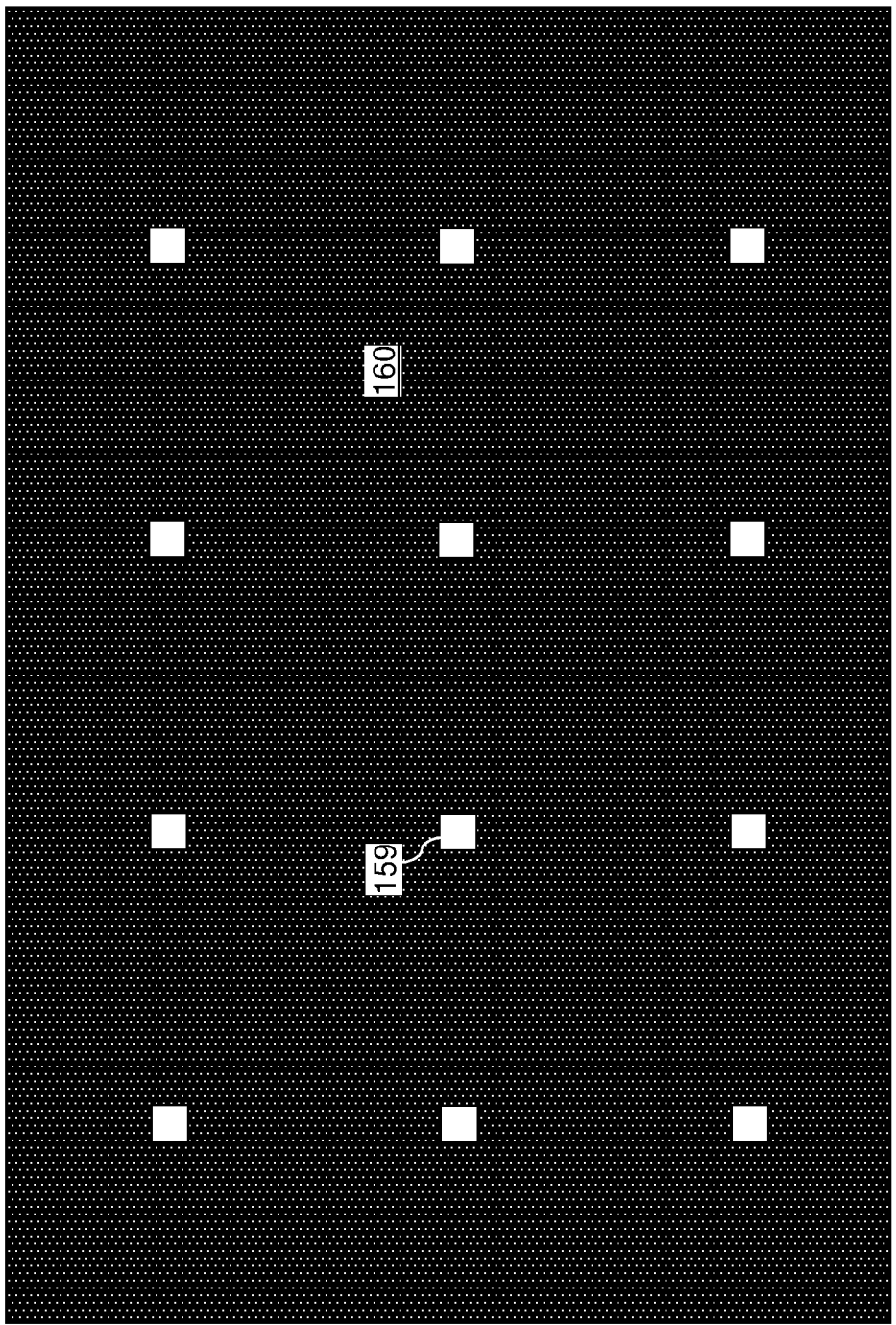
FIG. 4B is a top-down view of the patterned black matrix layer of FIG. 4A.

Referring to FIGS. 4A and 4B, a transparent cover plate 140 coated with a patterned black matrix layer 160 can be provided. The transparent cover plate 140 includes a transparent material such as a silicate glass or a transparent plastic material. The transparent cover plate 140 can optionally include an anti-glare layer, an anti-reflective material layer, an electromagnetic interference (EMI) shielding layer (which can include a transparent conductive material such as indium tin oxide), a circular polarizer material layer, or any combination thereof. Each of the anti-glare layer, the anti-reflective material layer, the electromagnetic interference (EMI) shielding layer, and the circular polarizer material layer can have a respective uniform thickness throughout. The thickness of the transparent cover plate 140 can be in a range from 100 microns to 5 mm, although lesser and greater thicknesses can also be employed. In one embodiment, the transparent cover plate 140 may be a touch sensitive glass substrate and additional touch sensors (i.e., tactile sensors) are located over the backplane 400. In this embodiment, the direct view display can also be a touch sensitive display in which the image formed by light from the LED pixels is controlled or adjusted by human touch.

The black matrix layer 160 includes a "black material." As used herein, a "black material" refers to a material having a transmittance at 600 nm that is less than 1% and having a reflectance at 600 nm that is less than 10%. It is understood that the black material needs to have a minimum thickness to provide the transmittance at 600 nm that is less than 1% and the reflectance at 600 nm that is less than 10%. In one embodiment, the black matrix layer 160 can have a transmittance less than 3% within the entire wavelength range from 400 nm to 800 nm (i.e., throughout the visible wavelength range), and a reflectance less than 15% within the entire wavelength range from 400 nm to 800 nm. The black matrix layer 160 can include an inorganic dielectric material, an organic dielectric material, a black metal or metal oxide layer, or a metallic layer stack with thicknesses of the component material layers tailored to provide destructive interference among rays that are reflected at different interfaces.

In one embodiment, the black matrix layer 160 can include a black material having a thickness less than 10 microns, and preferably less than 5 microns, such as less than 3 microns and/or less than 2 microns and/or less than 1 micron. In one embodiment, the thickness of the black matrix layer 160 can be in a range from 100 nm to 2 microns. In one embodiment, the black matrix layer 160 can include an inorganic material. In an illustrative example, the black matrix layer 160 can include a commercially available non-carbon negative tone imaging material such as the black material series of COLOR MOSAIC® available from Fujifilm®. The black material series of COLOR MOSAIC® includes high optical density materials providing high light-shielding performance. Alternatively, the black matrix layer 160 can be a chromium layer, a chromium oxide layer, a carbon black layer or a resin containing a black pigment.

The black matrix layer 160 can be deposited on a proximal surface (i.e., the surface that is proximal to the backplane) of the transparent cover plate 140. In one embodiment, the black matrix layer 160 can be formed as a patterned material layer by direct printing on the proximal surface of the transparent cover plate 140. Alternatively, the black matrix layer 160 can be deposited on the proximal surface of the transparent cover plate 140 as an unpatterned (blanket) material layer, and can be lithographically patterned, for example, by application and patterning of a photoresist layer thereupon, and removal of physically exposed portions of the black matrix layer 160 that are not covered by the patterned photoresist layer. The photoresist layer can be subsequently removed, for example, by ashing or by dissolution in a solvent. The pattern in the black matrix layer 160 includes a pattern of an array of openings 159, which can have the same shapes as the shapes of the array of light emitting diodes 10. Generally, the black matrix layer 160 can be patterned to provide an array of openings 159 therethrough such that the array of openings 159 overlies the array of light emitting diodes 10, and covers areas under which light emitting diodes 10 are not present. In one embodiment, the areas of the openings 159 through the black matrix layer 160 can be identical to the areas of the array of light emitting diodes 10. In one embodiment, the array of openings 159 through the black matrix layer 160 and the array of light emitting diodes 10 can be two-dimensional periodic arrays having the same two-dimensional periodicity.

In one embodiment, the light emitting diodes 10 can be micro-light emitting diodes (microLED's) including a III-V compound active region (i.e., a light emitting region) and having a maximum lateral dimension of less than 1 mm, such as in a range from 1 micron to 150 microns. In this case, the area of each opening 159 through the black matrix layer 160 can have the same lateral dimensions as the lateral dimensions of the underlying light emitting diodes, and thus, can have maximum lateral dimensions in a range from 1 micron to 150 microns.

Figure 5:
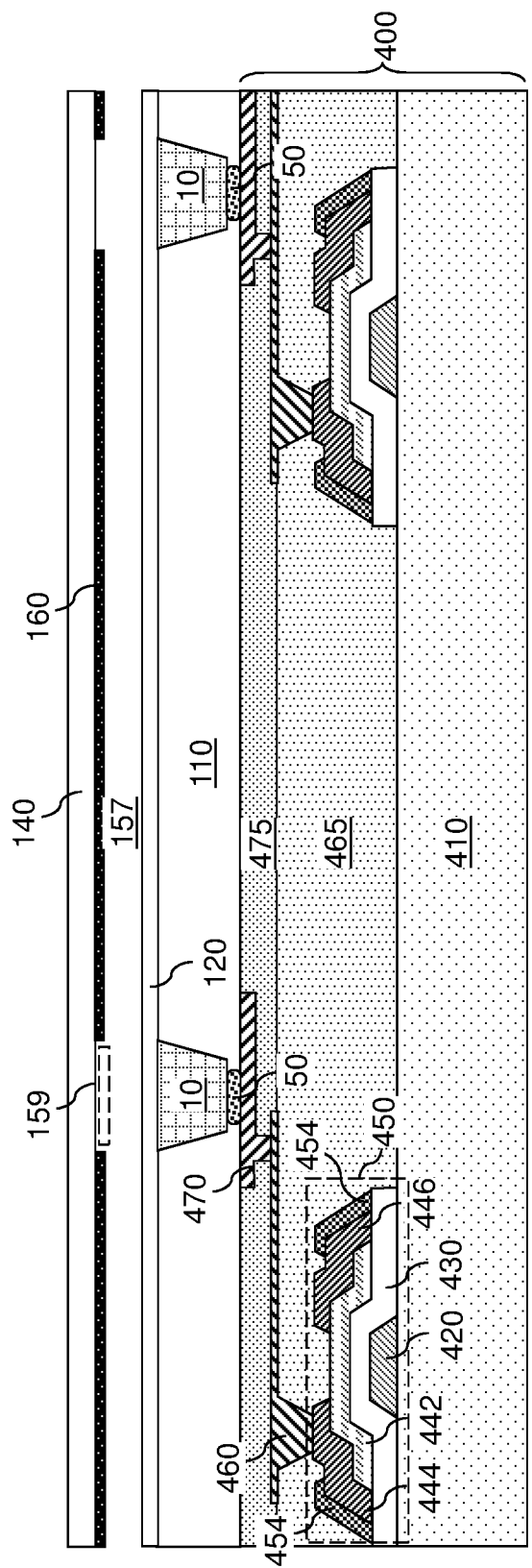
FIG. 5 is a vertical cross-sectional view of the exemplary structure after attaching the transparent cover plate on a front side of the array of light emitting diodes according to an embodiment of the present disclosure.

Referring to FIG. 5, the transparent cover plate 140 can be disposed over the front side of the transparent conductive layer 120. The black matrix layer 160 is disposed on the proximal surface of the transparent cover plate 140 that faces the transparent conductive layer 120. The transparent cover plate 140 can be vertically spaced from the front side of the transparent conductive layer 120 by a gap 157 that is not filled with any solid material or a liquid material at this step. The transparent cover plate 140 can be aligned to the array of light emitting diodes 10 such that each opening 159 in the array of openings 159 through the black matrix layer 160 overlies a respective light emitting diode 10 among the array of light emitting diodes 10. The vertical spacing between the proximal surface of the transparent cover plate 140 and the front side surface of the transparent conductive layer 120 can be uniform throughout, and can be greater than the thickness of the black matrix layer 160. For example, the vertical spacing between the proximal surface of the transparent cover plate 140 and the front side surface of the transparent conductive layer 120 can be in a range from 1 micron to 30 microns, such as from 2 microns to 10 microns, although lesser and greater vertical spacings can also be employed. The transparent cover plate 140 can be attached to the front side of the array of light emitting diodes 10 by suitable means, which can include, for example, clip-on features provided at the periphery of the array of light emitting diodes 10 and at the periphery of the transparent cover plate 140.

Figure 6:
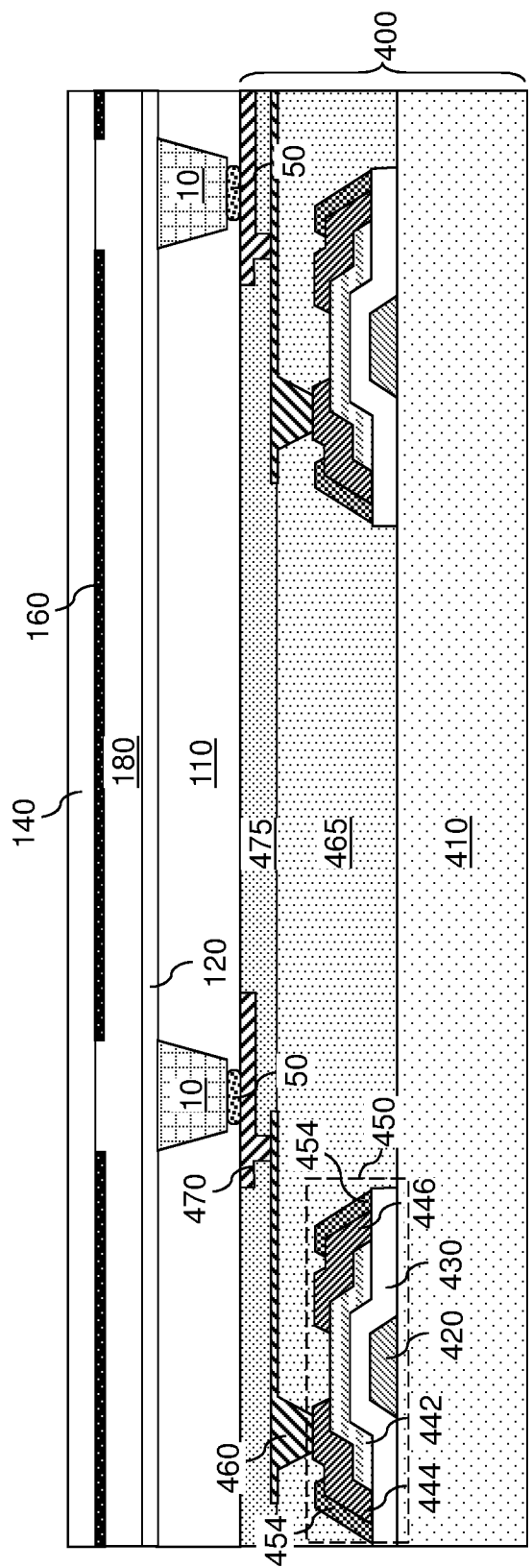
FIG. 6 is a vertical cross-sectional view of the exemplary structure after forming an optical bonding layer between the transparent conductive layer and the transparent cover plate according to an embodiment of the present disclosure.

Referring to FIG. 6, an optical bonding layer 180 can be formed between the transparent conductive layer 120 and the transparent cover plate 140 by filling the volume of the gap 157 with a transparent optical material. In one embodiment, the gap 157 can be filled with the optical bonding layer 180 by injecting a transparent dielectric material into the gap 157. In one embodiment, the optical bonding layer 180 transmits at least 80%, such as 85 to 99% of visible light in the range of 400 nm to 800 nm. In one embodiment, the optical bonding layer is a polymer or elastomer material which is formed by injection of one or more of its precursors into the gap 157 in the liquid state followed by solidification after injection to form the optical bonding layer 180. The solidification may be provided by heat, moisture, and/or ultraviolet (UV) radiation. For example, the optical bonding layer may be a thermoset polymer or elastomer which is set by heat. Alternatively, the optical bonding layer may be a UV or moisture curable polymer or elastomer.

In one embodiment, the optical bonding layer 180 comprises an optical grade liquid silicone rubber (LSR) material (e.g., a transparent, thermoset silicone elastomer which is applied in the liquid state and then solidified by heat). For example, the optical bonding layer 180 can include silicone including an ethylene oxide pendant group, a fluoro-containing pendant group, and an aromatic pendant group. An optical bonding layer 180 including silicone can have a refractive index at 600 nm in a range from 1.37 to 1.45. In one embodiment, the difference between the refractive index at 600 nm of the transparent cover plate 140 and the refractive index of the optical bonding layer 180 is less than 0.1, such as 0 to 0.075. In one embodiment, the transparent cover plate 140 can include a transparent plastic material having a refractive index at 600 nm in a range from 1.30 to 1.70, and preferably in a range from 1.30 to 1.55, and the optical bonding layer 180 can include silicone can have a refractive index at 600 nm in a range from 1.37 to 1.45. In one embodiment, the transparent cover plate 140 can include a silicate glass having a refractive index at 600 nm in a range from 1.46 to 1.54, and the optical bonding layer 180 can include silicone can have a refractive index at 600 nm in a range from 1.37 to 1.45. In one embodiment, the difference between the refractive index at 600 nm of the cover plate 140 and the refractive index at 600 nm of the optical bonding layer 180 can be less than 0.02, such as 0 to 0.01. In one embodiment, the optical bonding layer comprises an index matching dielectric layer.

The optical bonding layer 180 can contact a bottom surface of the black matrix layer 160 in areas outside of the array of openings 159 through the black matrix layer 160. Further, the optical bonding layer 180 can contact a bottom surface of the transparent cover plate 140 in areas inside the array of openings 159 through the black matrix layer 160.

Referring to all drawings and according to various embodiments of the present disclosure, a light emitting device is provided, which comprises: a backplane 400, an array of light emitting diodes 10 attached to a front side of the backplane 400, a transparent conductive layer 120 contacting front side surfaces of the light emitting diodes 10, an optical bonding layer 180 located on a front side surface of the transparent conductive layer 120, a transparent cover plate 140 located on a front side surface of the optical bonding layer 180, and a black matrix layer 160 including an array of openings 159 therethrough located between the optical bonding layer 180 and the transparent cover plate 140.

In one embodiment, the light emitting device comprises a dielectric matrix layer 110 located on the front side of the backplane 400 and laterally surrounding the array of light emitting diodes 10. In one embodiment, each opening 159 in the array of openings 159 through the black matrix layer 160 overlies a respective light emitting diode 10 of the array of light emitting diodes 10. In one embodiment, the array of openings 159 through the black matrix layer 160 and the array of light emitting diodes 10 are two-dimensional periodic arrays having a same two-dimensional periodicity.

In one embodiment, the optical bonding layer 180 contacts a bottom surface of the black matrix layer 160 in areas outside of the array of openings 159 through the black matrix layer 160, and contacts a bottom surface of the transparent cover plate 140 in areas inside the array of openings 159 through the black matrix layer 160. In one embodiment, the black matrix layer 160 has a transmittance at 600 nm that is less than 1% and has a reflectance at 600 nm that is less than 10%.

In one embodiment, the optical bonding layer 180 comprises a transparent silicone rubber. In one embodiment, the optical bonding layer 180 comprises a silicone having an ethylene oxide pendant group, a fluoro-containing pendant group, and an aromatic pendant group. In one embodiment, a difference between a refractive index at 600 nm of the transparent cover plate 140 and a refractive index of the optical bonding layer 180 is less than 0.1, such as 0 to 0.075.

In one embodiment, the light emitting device comprises a direct view display device. A maximum lateral dimension of light emitting diodes 10 within the array of light emitting diodes 10 is less than 150 microns. A minimum separation distance between neighboring pairs of light emitting diodes 10 within the array of light emitting diodes 10 can be greater than the maximum lateral dimension of the light emitting diodes 10 within the array of light emitting diodes 10.

In one embodiment, the ratio of the total area of the openings 159 through the black matrix layer 160 to the ratio of an area enclosed by an outer periphery of the black matrix layer 160 can be in a range from 0.001 to 0.25, and may be in a range from 0.01 to 0.1.

The black matrix layer 160 can directly contact the proximal surface of the transparent cover plate 140, i.e., the surface that is proximal to the array of light emitting diodes 10. The black matrix layer 160 can include an inorganic material (e.g., a dielectric or metal layer), an organic material, or a metallic layer stack.

The transparent cover plate 140 can include an anti-glare layer, an anti-reflective material layer, an electromagnetic interference shielding layer, a linear polarizer material layer, or any combination thereof. Each of the anti-glare layer, the anti-reflective material layer, the electromagnetic interference shielding layer, and the circular polarizer material layer may be an unpatterned planar layer having a respective uniform thickness.

The optical bonding layer 180 of the embodiments of the present disclosure can increase optical clarity of the light emitting device. The optical bonding layer reduces a difference in the index of refraction between the transparent cover plate 140 and the transparent conductive layer 120, which reduces reflection
at the bottom surface of the transparent cover plate 140 and the top surface of the transparent conductive layer 120. Furthermore, the black matrix layer 160 reduces the amount of light reflected from the interface between the optical bonding layer 180 and the transparent conductive layer 120 that exits the front side of the light emitting device.

The optical bonding layer 180 can also protect the display area of the light emitting device from ambient, e.g., from dust and moisture. Further, the optical bonding layer 180 of the present disclosure can protect the light emitting diodes 10 against scratch and other mechanical damages during usage of the light emitting device.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:

1. A light emitting device comprising:
a backplane;
an array of light emitting diodes attached to a front side of the backplane through an array of solder contacts;
a transparent conductive layer contacting front side surfaces of the light emitting diodes;
an optical bonding layer located over a front side surface of the transparent conductive layer;
a transparent cover plate located over a front side surface of the optical bonding layer; and
a black matrix layer including an array of openings therethrough, wherein the black matrix layer is located between the optical bonding layer and the transparent cover plate,
wherein a bottom surface of the optical bonding layer forms a continuous planar interface with an upper surface of the transparent conductive layer that extends continuously over respective front side surfaces of a plurality of light emitting diodes of the array of light emitting diodes, and an upper surface of the optical bonding layer contacts a bottom surface of the black matrix layer in areas outside of the array of openings through the black matrix layer,
wherein the upper surface of the optical bonding layer contacts a bottom surface of the transparent cover plate in areas inside the array of openings through the black matrix layer, and
wherein the optical bonding layer extends continuously under the bottom surface of the black matrix layer from a first opening to a second opening of the array of openings through the black matrix layer.

2. The light emitting device of claim 1, further comprising a dielectric matrix layer located on the front side of the backplane and laterally surrounding the array of light emitting diodes.

3. The light emitting device of claim 1, wherein each opening in the array of openings through the black matrix layer overlies a respective light emitting diode of the array of light emitting diodes, and
wherein the optical bonding layer comprises a uniform material layer that extends continuously under the bottom surface of the black matrix layer from the first opening to the second opening of the array of openings through the black matrix layer.

4. The light emitting device of claim 1, wherein the array of openings through the black matrix layer and the array of light emitting diodes are two-dimensional periodic arrays having a same two-dimensional periodicity.

5. The light emitting device of claim 1, wherein the black matrix layer has a transmittance at 600 nm that is less than 1% and has a reflectance at 600 nm that is less than 10%.

6. The light emitting device of claim 1, wherein the optical bonding layer comprises a transparent silicone rubber.

7. The light emitting device of claim 1, wherein a difference between a refractive index at 600 nm of the transparent cover plate and a refractive index of the optical bonding layer is less than 0.1.

8. The light emitting device of claim 1, wherein the light emitting device comprises a direct view display device.

9. The light emitting device of claim 8, wherein:
a maximum lateral dimension of light emitting diodes within the array of light emitting diodes is less than 150 microns; and
a minimum separation distance between neighboring pairs of light emitting diodes within the array of light emitting diodes is greater than a maximum lateral dimension of the light emitting diodes within the array of light emitting diodes.

10. The light emitting device of claim 2, wherein the backplane comprises an array of bonding pads for attaching the array of light emitting diodes.

11. The light emitting device of claim 10, wherein a lateral extent of a bonding pad of the array of bonding pads is greater than a lateral extent of a corresponding solder contact of the array of solder contacts.

12. The light emitting device of claim 10, wherein the dielectric matrix layer directly contacts the front side of the backplane.

13. The light emitting device of claim 12, wherein an interface between the dielectric matrix layer and the front side of the backplane and an interface between the bonding pads of the array of bonding pads and the solder contacts of the array of solder contacts are at a same level.

14. A light emitting device comprising:
a backplane;
an array of light emitting diodes attached to a front side of the backplane through an array of solder contacts;
a transparent conductive layer contacting front side surfaces of the light emitting diodes;
an optical bonding layer located over a front side surface of the transparent conductive layer;
a transparent cover plate located over a front side surface of the optical bonding layer; and
a black matrix layer including an array of openings therethrough, wherein the black matrix layer is located between the optical bonding layer and the transparent cover plate,
wherein a bottom surface of the optical bonding layer forms a continuous planar interface with an upper surface of the transparent conductive layer that extends continuously over respective front side surfaces of a plurality of light emitting diodes of the array of light emitting diodes, and
wherein the optical bonding layer extends continuously under the bottom surface of the black matrix layer from a first opening to a second opening of the array of openings through the black matrix layer, and
wherein the optical bonding layer contacts a bottom surface of the transparent cover plate through at least one opening of the array of openings.

15. The light emitting device of claim 14, wherein an upper surface of the optical bonding layer contacts a bottom surface of the black matrix layer in areas outside of the array of openings through the black matrix layer.

16. The light emitting device of claim 14, further comprising a dielectric matrix layer located on the front side of the backplane and laterally surrounding the array of light emitting diodes.

17. The light emitting device of claim 16, wherein the backplane comprises an array of bonding pads for attaching the array of light emitting diodes.

18. The light emitting device of claim 17, wherein a lateral extent of a bonding pad of the array of bonding pads is greater than a lateral extent of a corresponding solder contact of the array of solder contacts.

19. A light emitting device comprising:
a backplane;
an array of light emitting diodes attached to a front side of the backplane through an array of solder contacts;
a transparent conductive layer contacting front side surfaces of the light emitting diodes;

an optical bonding layer located over a front side surface of the transparent conductive layer;
a transparent cover plate located over a front side surface of the optical bonding layer; and
a black matrix layer including an array of openings therethrough, wherein the black matrix layer is located between the optical bonding layer and the transparent cover plate,
wherein an upper surface of the optical bonding layer contacts a bottom surface of the black matrix layer in areas outside of the array of openings through the black matrix layer,
wherein the optical bonding layer extends continuously under the bottom surface of the black matrix layer from a first opening to a second opening of the array of openings through the black matrix layer, and
wherein the optical bonding layer contacts a bottom surface of the transparent cover plate through at least one opening of the array of openings.

20. The light emitting device of claim 19, further comprising a dielectric matrix layer located on the front side of the backplane and laterally surrounding the array of light emitting diodes,
wherein the backplane comprises an array of bonding pads for attaching the array of light emitting diodes,
wherein a lateral extent of a bonding pad of the array of bonding pads is greater than a lateral extent of a corresponding solder contact of the array of solder contacts,
wherein the dielectric matrix layer directly contacts the front side of the backplane, and
wherein an interface between the dielectric matrix layer and the front side of the backplane and an interface between the bonding pads of the array of bonding pads and the solder contacts of the array of solder contacts are at a same level.

* * * * *